(12) United States Patent
Lau

(10) Patent No.: US 6,498,546 B1
(45) Date of Patent: Dec. 24, 2002

(54) UTILIZATION OF PROXIMITY EFFECT IN RIPPLE NOISE FILTERING

(76) Inventor: James Leych Lau, 1719 S. Grand Ave., Santa Ana, CA (US) 92705

(*) Notice: Subject to any disclaimer, the term of this patent is extended or adjusted under 35 U.S.C. 154(b) by 34 days.

(21) Appl. No.: 09/648,987

(22) Filed: Aug. 25, 2000

(51) Int. Cl.⁷ .................................................. H03H 7/00
(52) U.S. Cl. ........................................ 333/181; 333/184
(58) Field of Search ................................ 333/181, 184, 333/185, 12

(56) References Cited

U.S. PATENT DOCUMENTS

| | | | | |
|---|---|---|---|---|
| 4,584,768 A | * | 4/1986 | Tosti | 29/878 |
| 5,493,472 A | * | 2/1996 | Lavene | 361/329 |
| 5,812,384 A | * | 9/1998 | Ramakrishnan et al. | 363/39 |
| 6,144,269 A | * | 11/2000 | Okamoto et al. | 333/184 |

FOREIGN PATENT DOCUMENTS

JP     402312309 A   * 12/1990

OTHER PUBLICATIONS

O'Meara, "Proximity Losses in AC Magnetic Devices", *PCIM*, Dec. 1996, pp. 52–57.

* cited by examiner

*Primary Examiner*—Robert Pascal
*Assistant Examiner*—Joseph Chang

(57) ABSTRACT

An electrical noise-filtering assembly includes first and second busbars. The first busbar is spaced from the second busbar at a fixed distance sufficient to induce the proximity effect. As arranged, high frequency noise having high order harmonics adhere to the surfaces spaced by the fixed distance. Noise can be removed efficiently by disposing low equivalent series resistance (ESR) noise filters between the surfaces where the noise harmonics concentrate.

2 Claims, 5 Drawing Sheets

UTILIZATION OF PROXIMITY EFFECT IN RIPPLE NOISE FILTERING

BACKGROUND OF THE INVENTION

1. Field of the Invention

The present invention relates generally to electrical noise filtering, and more particularly, to filtering of high-frequency ripple noise from electrical circuits.

2. Description of the Related Art

When an alternating current (AC) passes through a conductor, depending on the alternating frequency, the current tends to crowd itself near the surface of the conductor. This phenomenon is called the "skin effect" and is known in the art.

FIG. 1 diagrammatically depicts the skin effect in which a cross-sectional area A of a conductor 2 carrying an AC current i in a direction 4 which is perpendicular to and out of the figure. Depending on the frequency of the AC current i, the current i tends to propagate near the surface S of the conductor 2. The higher the frequency, the more the current i travels proximally to the surface S. Skin effect arises from the fact that the current i at different points in the cross-sectional area A does not encounter equal inductance. The current i confronts higher inductance, specifically self-inductance, near the center C of the cross-sectional area A. At the same time, there is much less self-inductance experienced by the current i near the skin surface S of the conductor 2. As a consequence, an uneven current distribution results. The current density near the skin surface S is much higher than the corresponding current density near the center of the area A. With the majority of the current crowds near the conductor skin surface S which has a limited cross-sectional area in comparison to the total area A, the uneven current distribution in effect increases the overall resistance of the conductor 2.

Two main factors contribute to the skin effect, they are, namely, the cross-sectional area of the conductor and the frequency of the current passing through the conductor. Referring back to FIG. 1, when the current i passes through a large cross-sectional area A, even at low frequency such as 60 Hz (Hertz), skin effect can be eminent. Alternatively, effective resistance also substantially increases when the AC current i alternates at high frequency, even with the cross-sectional area A relatively small in dimension. However, most detrimental of all is when the current i passes through the conductor 2 with a large cross-sectional area A and alternates at high frequency.

In reality, the combination of the aforementioned factors occurs in the design of power supplies and related circuits. For example, shown in FIG. 2 is a side elevational view, somewhat schematically, of a section of a pair of power busbars 6 and 8 driving a load 9. The busbars 6 and 8 are in turn driven by a power supply 5. As is known in the art, to supply a high current output with a manageable physical size, the power supply 5 needs to be built as a switch-mode power supply. Modern day power supplies are mostly designed to be miniaturized in size. To accomplish this end, switching frequencies of the power supplies are driven at very high ranges. The rapid switching power supply 5 is a source of high frequency noise which, if not properly controlled, is detrimental to the operation of the load 9. The noise problem associated with the power supply 5 will be explained further below.

FIG. 3 is a cross-sectional view taken along the line 3—3 of FIG. 2. The busbars 6 and 8 can be found in a high-current output power supply used to drive Internet routers, for example. The busbars 6 and 8 respectively carry currents 10 and 12 as shown in FIGS. 2 and 3. The directions of current flow for currents 10 and 12 are opposite to each other in this case. Depending on the load 9, the currents 10 and 12 may assume high values. As such, the busbars 6 and 8 are normally designed with large cross-sectional areas. Each busbar 6 or 8 is intended to carry a direct current (DC). However, superimposed on the DC component of each current 10 or 12 is normally high-frequency noise. FIG. 4 graphically shows a typical current characteristic of the busbar 6 or 8. As shown in FIG. 4, there is a DC component signified by the reference numeral 14, and a noise component labeled 16. The noise 16 comes from a variety of sources with a wide spectrum of frequency ranges. As mentioned above, modern day fast switching power supplies substantially aggravate the noise problem. For example, a major portion of the noise 16 may come from switching rectifiers and MOSFETs (Metal Oxide Semiconductor Field Effect Transistors) which are key components of the power supply 5.

The presence of the noise 16 is undesirable in several respects. Chief among all is the impairment of operational reliability of the load 9. The noise 16 can cause false triggering of logical circuits, as well as erroneous electrical level processing of analog circuits in the load 9. The noise 16, if unmanaged, can render the load 9 totally malfunctional.

Not to be overlooked is the fact that the noise 16 is high-frequency in nature and the skin effect normally takes into effect. For reasons as stated above, the noise 16 tends to crowd itself near the skin surface of the busbars 6 and 8 when propagating through the busbars 6 and 8, as diagrammatically shown in FIG. 3. The noise currents passing through the limited cross-sectional areas near the busbar skins generate unwanted heat which further aggrevates the reliability of the components placed adjacent to the busbars 6 and 8. Quite often, in high-frequency applications, the heat generated can be substantial.

For reasons as stated above, the noise 16 is normally filtered away before reaching any load. Heretofore, filtering of noise on the busbars 6 and 8 has mostly been accomplished by placing noise filtering capacitors 18 between the busbars 6 and 8, irrespective of the distance between the busbars 6 and 8. As a consequence, only a portion of the noise is filtered. That is, noise is filtered only in the areas at or near the capacitors 18. The majority of noise 16 away from the capacitors, such as the noise at the three skin surfaces 6A, 6B and 6C of the busbar 6 remain intact and may not be affected at all. Similarly, noise 16 clustering at the other three surface skins 8A, 8B and 8C away from the capacitors 18 on the busbar 8 may also escape filtering and goes directly to the load 9.

High frequency switching mode power supplies are commonly used to power electronic circuits. There has been a long-felt and increasing need to effectively and efficiently suppress the unwanted noise in practical applications.

SUMMARY OF THE INVENTION

It is accordingly the object of the invention to provide a circuit scheme which efficiently filters away unwanted noise, thereby improving operational reliability and curtails wasteful heat generation. The objective of effective noise filtering without resorting to elaborate and expensive implementation is also sought.

The noise filtering assembly of the invention includes first and second busbars. The first busbar is proximally spaced from the second busbar at a fixed distance sufficient to induce proximity effect. As arranged, when current passes through the busbars, the high frequency noise having higher order harmonics adhere to the surfaces spaced by the fixed distance. Noise can be removed efficiently by disposing low equivalent resistance noise filters between the surfaces where the noise harmonics concentrate.

In other embodiments, more than two busbars are proximally disposed together so as to enhance the proximity effect. Noise filters are also disposed on the busbar surfaces where the noise concentrates.

These and other features and advantages of the invention will be apparent to those skilled in the art from the following detailed description, taken together with the accompanying drawings, in which like reference numerals refer to like parts.

DETAILED DESCRIPTION OF THE INVENTION

Figure 1:
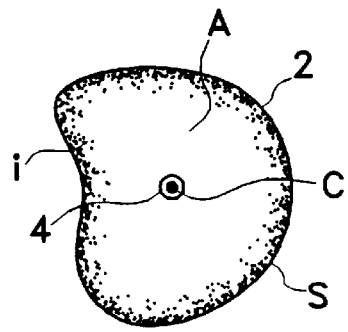
FIG. 1 is a cross-sectional view illustrating the skin effect when a current passes through a conductor.
Figure 3:
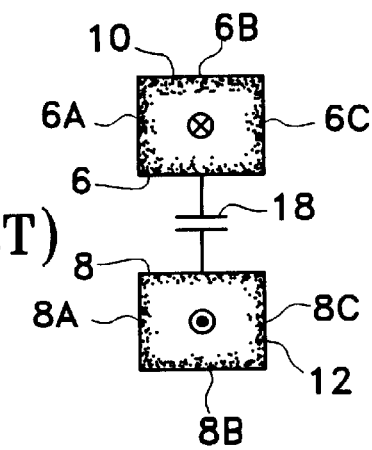
FIG. 3 is a cross-sectional view taken along the line 3—3 of FIG. 2.
Figure 2:
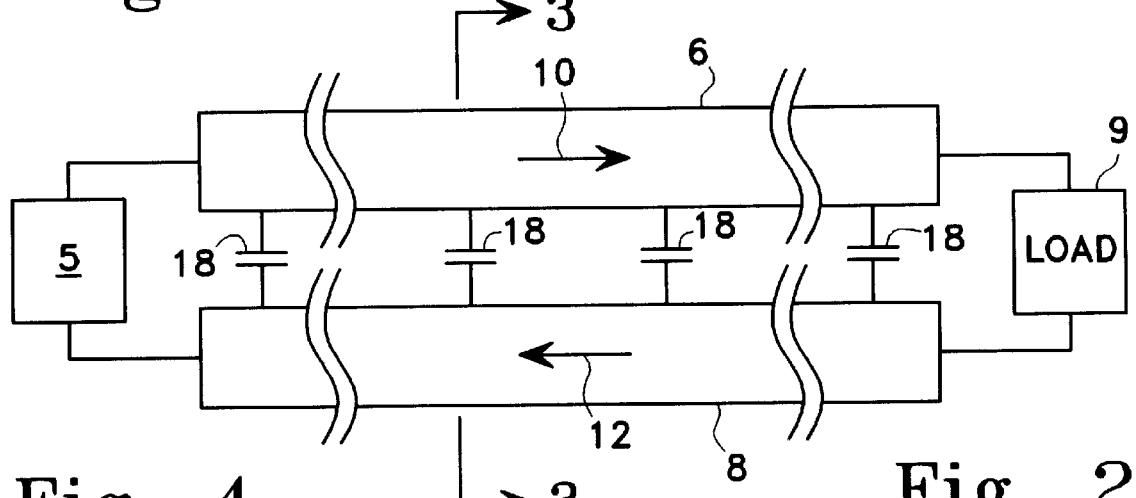
FIG. 2 is a schematic view showing a pair of busbars disposed between a power supply and a load.
Figure 4:
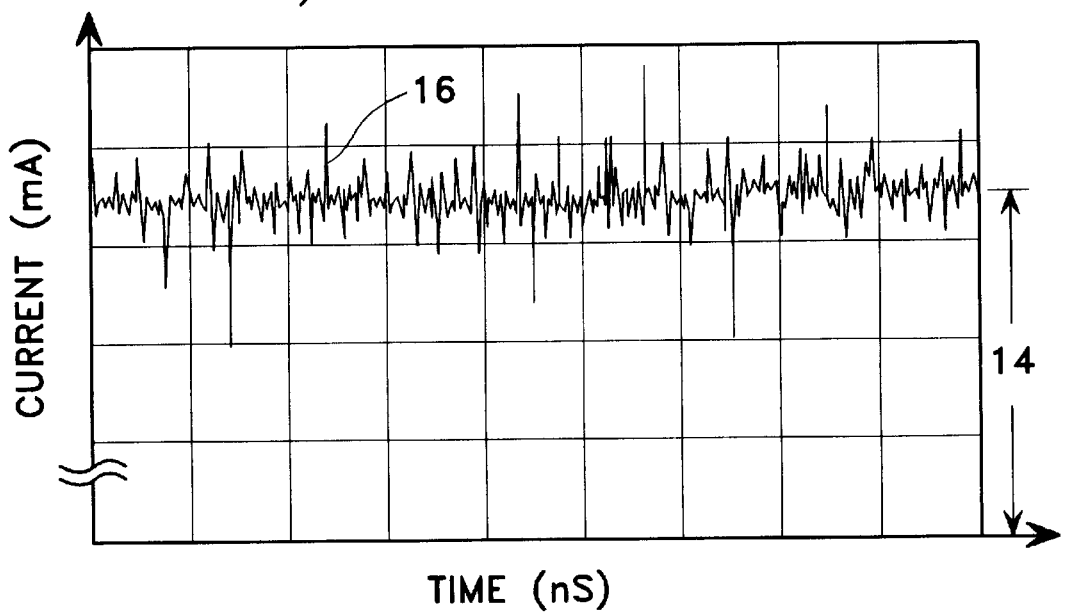
FIG. 4 is a graph illustrating a typical current characteristic of the busbars shown in FIGS. 1–4.
Figure 5:
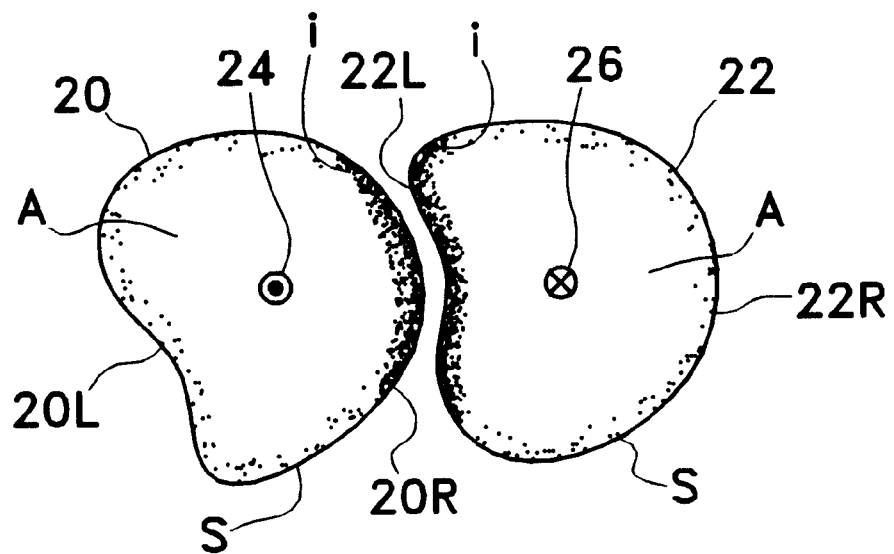
FIG. 5 is a cross-sectional view illustrating the proximity effect when two conductors carrying currents running in opposite directions are proximally positioned together.

Prior to describing the embodiments of the invention, there is another phenomenon called the "proximity effect" that needs first be explained. FIG. 5 diagrammatically depicts the proximity effect in which two conductors 20 and 22 are brought adjacent to but not in contact with each other. Assuming the conductors 20 and 22 each has a cross-sectional area A and a surface S. Further assuming the conductor 20 carries an AC current i in a direction 24 which is perpendicular to and out of FIG. 5. In a similar manner, the conductor 22 carries another AC current i in a direction 26 which is perpendicular to but points into FIG. 5. Depending on the physical separation of the conductors 20 and 22, the current distribution i in each conductor 20 and 22 is distorted. The closer the conductors 20 and 22 are brought near each other, the more distorted will be the current distribution. The proximity effect arises when the inductance of one conductor is effected by the mutual inductance of another conductor. For example, as shown in FIG. 5, the current i flowing through the conductor 20 in the proximal presence of the conductor 22 experiences not only the self-inductance of the conductor 20 but also the mutual inductance excerted by the conductor 22. As a consequence, the overall inductance on the right side 20R of the conductor 20 is lower than that at the left side 20L of the conductor 20. AC current always seeks a path with the lowest inductance to pass through. In this case, the current i passing through the conductor 20 tends to crowd itself at the right side 20R of the conductor 20. Under the principle of reciprocity, the current distribution in the conductor 22 can likewise be explained.

Figure 6:
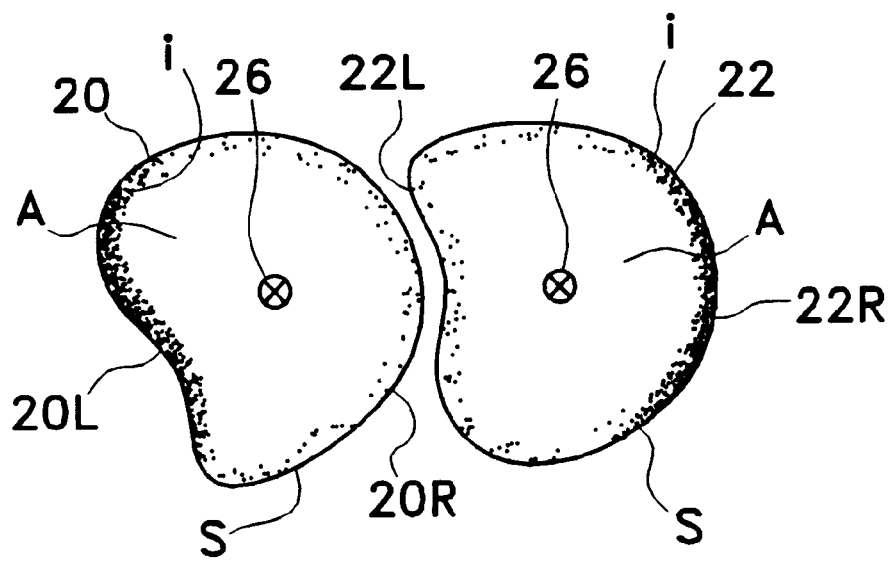
FIG. 6 is a cross-sectional view illustrating the proximity effect when two conductors carrying currents running in the same direction are proximally positioned together.

FIG. 5 shows the direction of current flows in the conductors 20 and 22 opposite to each other. In FIG. 6, the conductors 20 and 22 are shown as each carrying a current i flowing in the same direction 26. This time, the current distribution is substantially opposite to that as shown in FIG. 5. Specifically, for the conductor 20, the current i crowds itself on the left side 20L of the conductor 20. Similarly, for the conductor 22, the current i clusters itself on the right side 20R of the conductor 22. The explanation is substantially the same as above except the current polarity is reversed in the conductor 20. For the sake of conciseness, explanation of the current distribution shown in FIG. 6 is not further elaborated.

Figure 7:
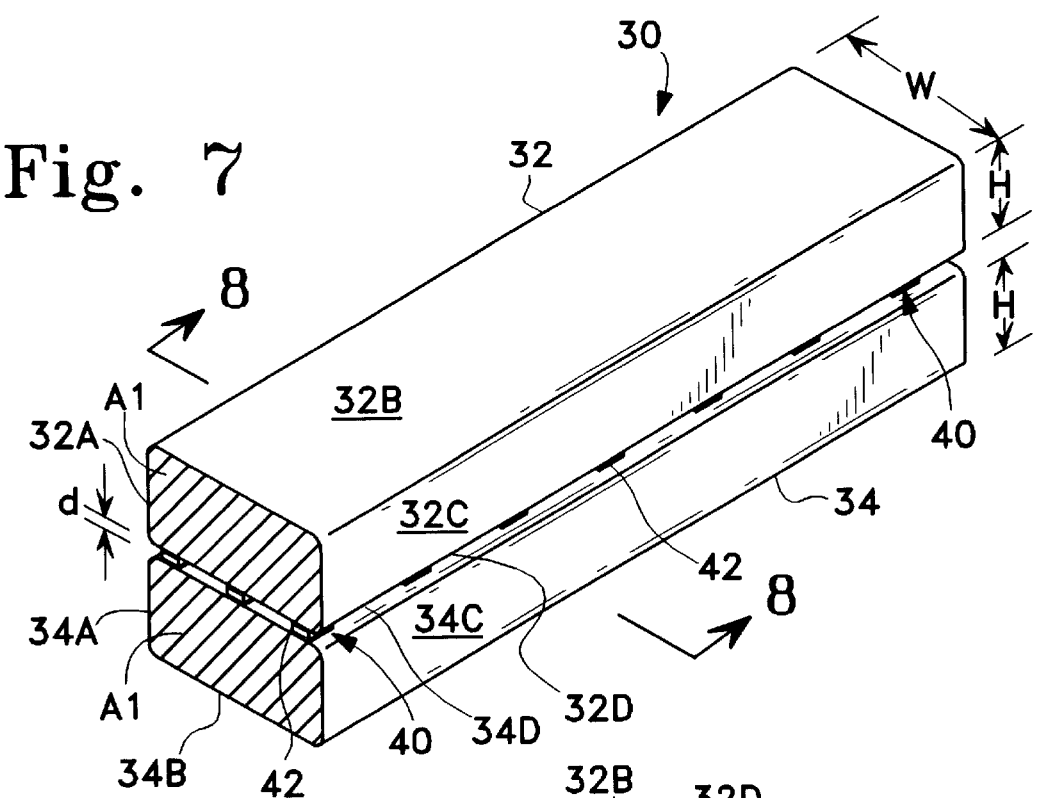
FIG. 7 is a perspective view which shows a first embodiment of the invention.
Figure 8:
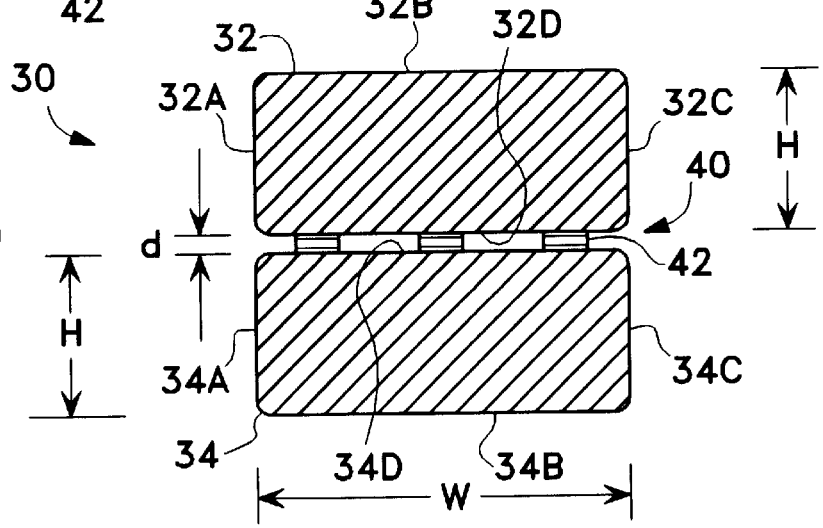
FIG. 8 is a cross-sectional view taken along the line 8—8 of FIG. 7.
Figure 9:
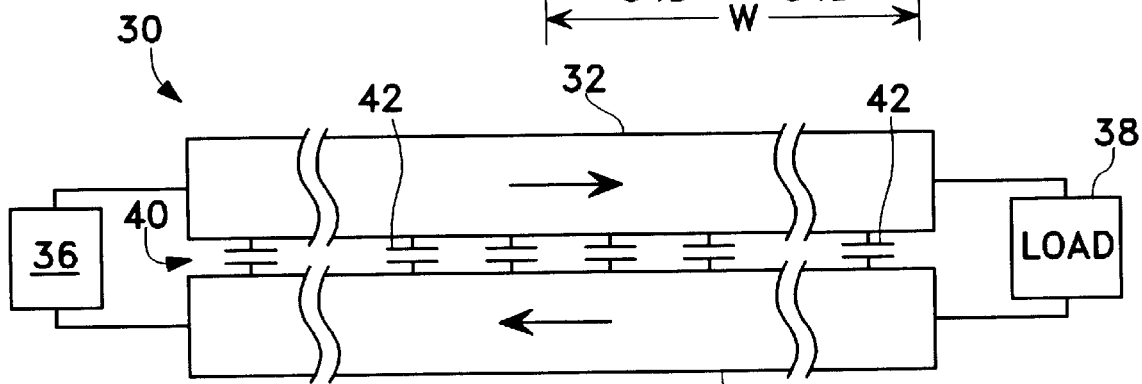
FIG. 9 is a schematic drawing of the first embodiment used in conjunction with a power supply and a load.

Reference is now directed to FIGS. 7–9 which show the first embodiment of the invention signified by the reference numeral 30. FIG. 7 is a perspective view showing the assembly of this embodiment having a section of a pair of busbars 32 and 34. FIG. 8 is a cross-sectional side view taken along the line 8—8 of FIG. 7. FIG. 9 is a schematic view of this embodiment illustrating the electrical disposition of the busbars 32 and 34 between a power supply 36 and a load 38.

In this embodiment, the busbar 32 has a cross-sectional area A1 and four longitudinal surfaces 32A–32D. Likewise, the busbar 34 has a cross-sectional area A1 and four longitudinal surfaces 34A–34D.

As shown in FIGS. 7–9, the busbars 32 and 34 are spaced by a distance d. There is also a plurality of noise filters 40 disposed between the busbars 32 and 34. In this embodiment, the noise filters 40 are capacitors with low equivalent series resistance (ESR).

In accordance with the invention, the value of d is chosen so as to induce the proximity effect as mentioned above once the proximity effect sets in, noise, which can be expressed as high-frequency harmonics under the Fourier analysis, mostly adheres to the closely positioned busbar surfaces 32D and 34D of the busbars 32 and 34, respectively. Because the noise filters 40, low ESR capacitors 42 in this case, are disposed between the surfaces 32D and 34D, the filters 40 can efficiently and effectively remove the noise. This is in contrast with most prior art arrangement in which the high frequency noise are located at other surfaces, such as the surfaces 32A–32C and 34A–34C respectively on the busbars 32 and 34, which are beyond the reach of the noise filters 40.

A exemplary design for the first embodiment 30 can have a width W of each busbar 32 or 34 to be 0.5 inch wide. The height H for each busbar 32 or 34 can be set at 0.2 inch high. The material for the busbars 32 and 34 can be copper (Cu)

plated with tin (Sn). The distance d between the busbars 32 and 34 can be from 0.05 inch to 0.2 inch, preferably at 0.1 inch apart. The capacitors used in this embodiment are ceramic chip capacitors, part number: C0805C224K5RAC, manufactured by KEMET Electronics Corporation of Greenville, S.C.

Figure 10:
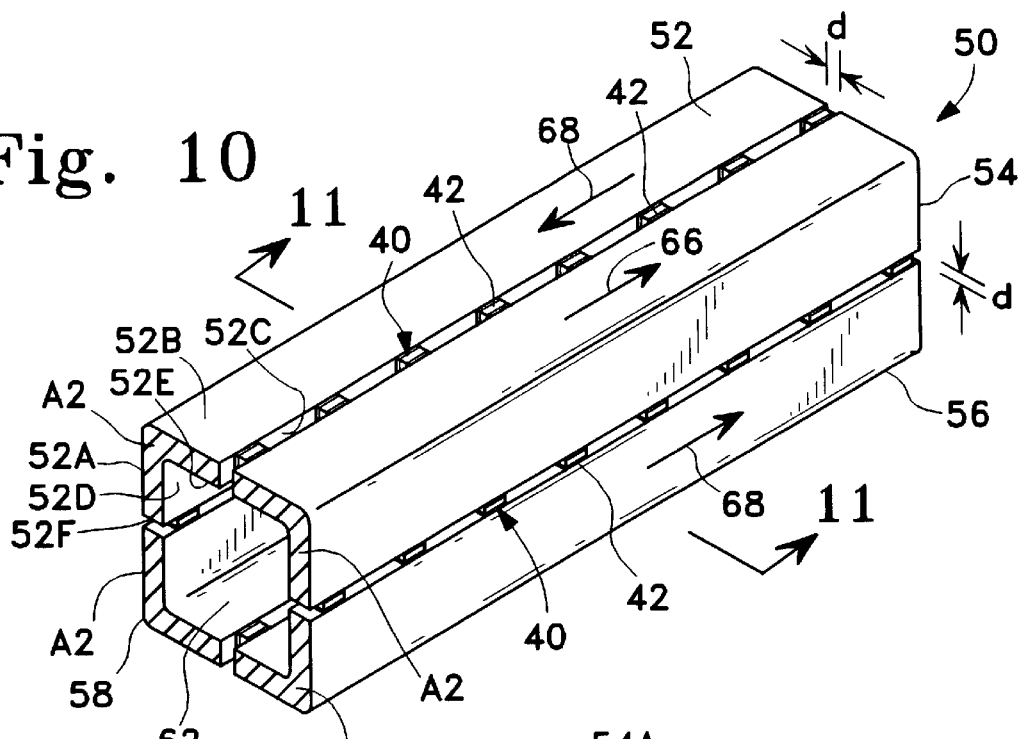
FIG. 10 is a perspective view which shows a second embodiment of the invention.
Figure 11:
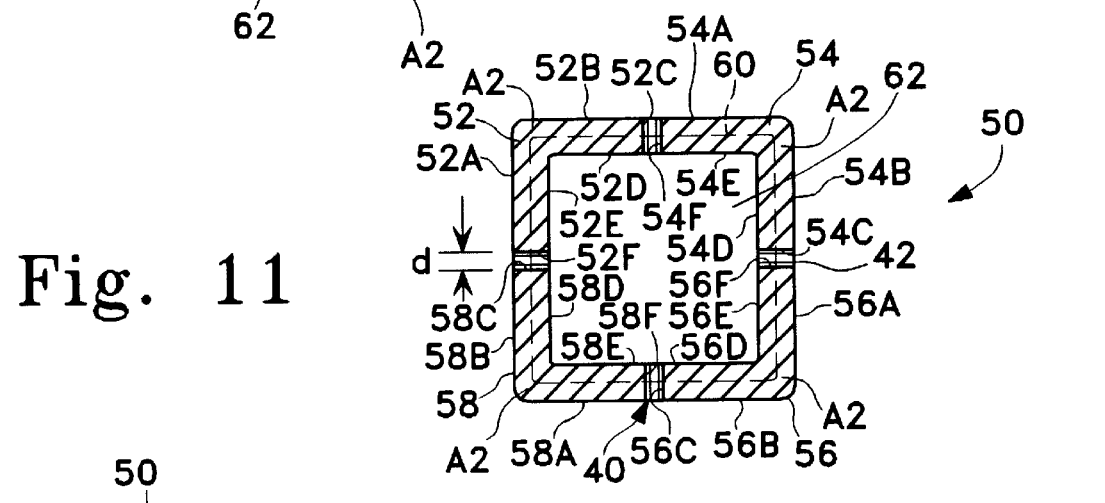
FIG. 11 is a cross-sectional view taken along the line 11—11 of FIG. 10.
Figure 12:
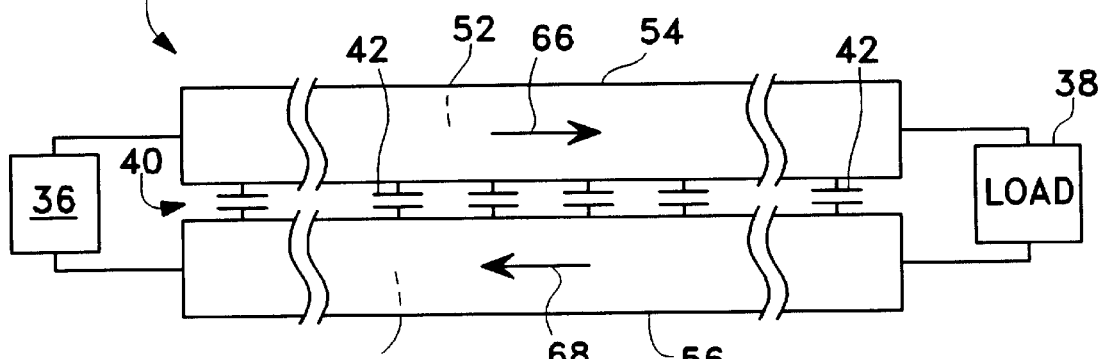
FIG. 12 is a schematic view of the first embodiment used in conjunction with a power supply and a load.

FIGS. 10–12 shows a second embodiment of the invention signified by the reference numeral 50. FIG. 10 is a perspective view depicting a section of this embodiment 50 having four busbars 52, 54, 56 and 58. Each busbar 52, 54 56 or 58 is disposed between two of the four busbars 52, 54, 56 and 58. In this embodiment, the 4 busbars 52, 54, 56 and 58 are adjacently disposed longitudinally side-by-side and somewhat forms a closed boundary 60 and enclosing a volume of space 62.

FIG. 11 is a cross-sectional side view taken along the line 11—11 of FIG. 10. FIG. 12 is a schematic view of this embodiment 50 illustrating the electrical disposition of the busbars 52, 54, 56 and 58 between a power supply 36 and a load 38.

In this embodiment, the busbar 52 has an angular-shaped cross-sectional area A2 and six longitudinal surfaces 52A–52F. Likewise, each of the other busbars 54, 56 and 58 has a cross-sectional area A2 and six surfaces 54A–54F, 56A–56F, and 58A–58F, respectively.

During normal operation, the directional flow of current of each busbar is different from that of the other two adjacent busbars. Thus, for example, the direction of current flow 66 in the busbar 54 is different and opposite to the directions of current flow 68 for the two adjacent busbars 52 and 56.

As shown in FIGS. 10–11, each busbar is spaced from the other busbar by a distance d. There is also a plurality of noise filters 40 disposed between any two of the busbars. For example, between the busbars 54 and 56, there is a plurality of noise filters 40 in the form of low ESR capacitors 42 distributed along the longitudinal directions of the busbars 54 and 56. The same holds true for the separations between the other busbars.

As with the previous embodiment, in accordance with the invention, the value of d is chosen to be as small as possible so as to induce the proximity effect, Once the proximity effect sets in, for each busbar 52, 54, 56 or 58, the high-frequency noise which can be expressed as a multiplicity of harmonics under the Fourier analysis, will migrate to the surfaces which are closely disposed adjacent to the other busbars. For instance, for the busbar 52, most of the noise harmonics will be found near the surfaces 52C and 52F, which are respectively adjacent to the busbars 54 and 58. Similarly, for the busbars 54, 56 and 58, most of the noise will be found near the surfaces 54C and 54F, 56C and 56F, 58C and 58F, respectively. As explained before, because the noise filters 40 are low ESR capacitors 42 disposed between the aforementioned closely adjacent surfaces, noise can be efficiently removed. This is in contrast with most prior art designs in which the high frequency noise are located at other surfaces, which are beyond the reach of the noise filters 40. The geometrical dimensions of this embodiment can be made comparable to the corresponding dimensions of the previous embodiment. The advantage of this embodiment are the edge surfaces 52C and 52F of the busbar 52, 54C and 54F of the busbar 54, 56C and 56F of the busbar 56, 58C and 58F of the busbar 58, are relatively narrow thereby allowing noise to be more controllably confined for removal.

Figure 13:
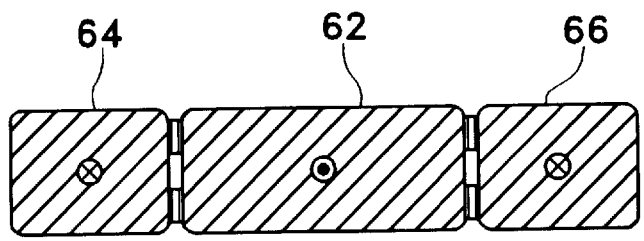
FIG. 13 is a cross-sectional view showing a variation of busbar arrangement in accordance with the invention.
Figure 14:
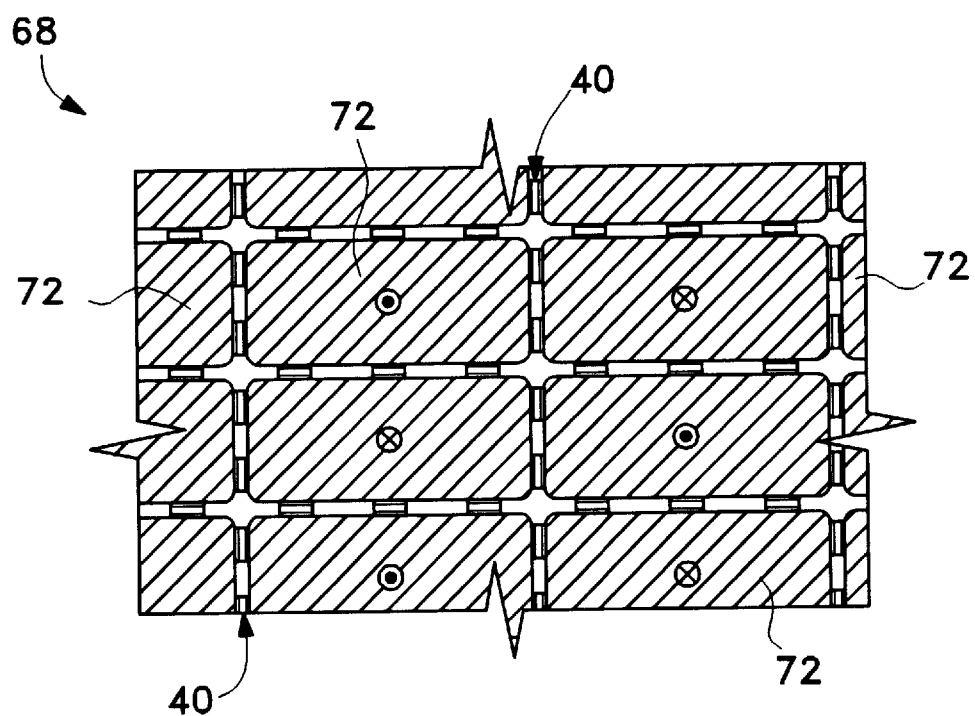
FIG. 14 is cross-sectional view showing busbars arranged in accordance with the invention in an array configuration.

Finally, other changes are possible within the scope of the invention. For all the embodiments as described, the adjacent busbars are described as arranged in even numbers. It certainly is possible to have an odd number of busbars in the assembly as shown in FIG. 13 in which a ground return busbar 62 is disposed between two other busbars 64 and 66, for example. Furthermore, the busbars can be arranged in the form of an array as shown in FIG. 14 which is a cross-sectional view of a part of an array 68 with a multiplicity of noise filters 40 disposed between the busbars 72. It will be understood by those skilled in the art that these and other changes in form and detail may be made therein without departing from the scope and spirit of the invention.

What is claimed is:

1. A power supply circuit assembly comprising:

a first busbar;

a second busbar proximally disposed adjacent said first busbar sufficient to cause proximity effect when said first and second busbars are substantially energized;

a third busbar proximally disposed adjacent said second busbar;

a fourth busbar proximally disposed between said first and third busbars; and a plurality of capacitors disposed between every two of said busbars which are adjacently disposed to each other.

2. The circuit assembly as set forth in claim 1 wherein said busbars are members of a busbar array.

\* \* \* \* \*

UNITED STATES PATENT AND TRADEMARK OFFICE
CERTIFICATE OF CORRECTION

PATENT NO.    : 6,498,546 B1
DATED         : December 24, 2002
INVENTOR(S)   : James Leych Lau It is certified that error appears in the above-identified patent and that said Letters Patent is hereby corrected as shown below:

<u>Title page,</u>
After item [56], insert the following:

-- [74] *Attorney, Agent, or Firm* - Kam T. Tam --

Signed and Sealed this

Thirteenth Day of May, 2003

JAMES E. ROGAN
*Director of the United States Patent and Trademark Office*